(12) United States Patent
Harris

(10) Patent No.: US 7,849,865 B2
(45) Date of Patent: Dec. 14, 2010

(54) SYSTEM FOR PROCESSING A WORKPIECE

(75) Inventor: Randy A. Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 993 days.

(21) Appl. No.: 11/620,508

(22) Filed: Jan. 5, 2007

(65) Prior Publication Data

US 2008/0163898 A1   Jul. 10, 2008

(51) Int. Cl.
*B08B 3/00*   (2006.01)

(52) U.S. Cl. .................................. 134/137; 134/192

(58) Field of Classification Search ....................... None
See application file for complete search history.

(56) References Cited

U.S. PATENT DOCUMENTS

| | | | |
|---|---|---|---|
| 4,903,717 A | | 2/1990 | Sumnitsch |
| 6,537,416 B1 | | 3/2003 | Mayer et al. |
| 6,810,888 B2 * | | 11/2004 | Tsuchiya et al. ......... 134/104.2 |
| 6,930,046 B2 * | | 8/2005 | Hanson et al. .............. 438/694 |
| 7,122,084 B2 | | 10/2006 | Hohenwarter |
| 7,144,459 B2 | | 12/2006 | Thompson et al. |
| 2004/0065540 A1 * | | 4/2004 | Mayer et al. ................. 204/198 |
| 2005/0031497 A1 * | | 2/2005 | Siebert et al. ............... 422/104 |
| 2005/0199503 A1 | | 9/2005 | Woodruff |
| 2007/0175500 A1 | | 8/2007 | Hohenwarter |

FOREIGN PATENT DOCUMENTS

DE     19801360 A1     7/1999

* cited by examiner

*Primary Examiner*—Michael Barr
*Assistant Examiner*—Jason Y Ko
(74) *Attorney, Agent, or Firm*—Perkins Coie LLP; Kenneth H. Ohriner

(57) ABSTRACT

A wafer processing system has a moveable drain assembly having multiple drain rings. The drain rings may be spaced apart sufficiently to allow a process fluid applicator to move between them. Each drain ring provides a separate drain path, optionally in a separate recirculation loop carrying a single process fluid. The drain rings may be sequentially moved into position to collect process fluid moving off of the workpiece. As a result, process fluids may be more uniformly applied and used process fluids can be separately removed, collected, and either recycled or processed for disposal. Mixing of used process fluids is largely avoided. A lower process fluid outlet allows for processing the back side of the wafer as well, without flipping the wafer.

16 Claims, 11 Drawing Sheets

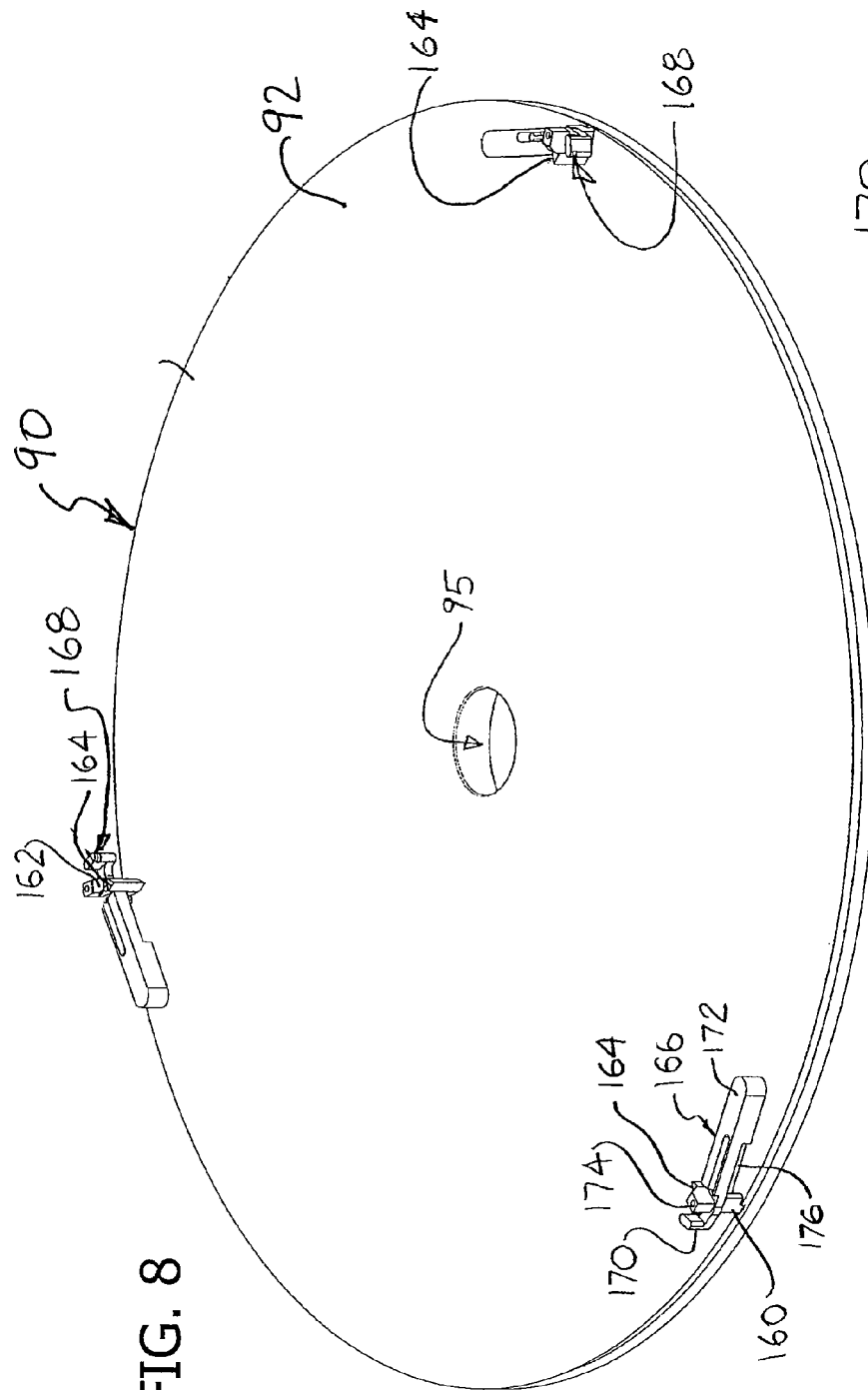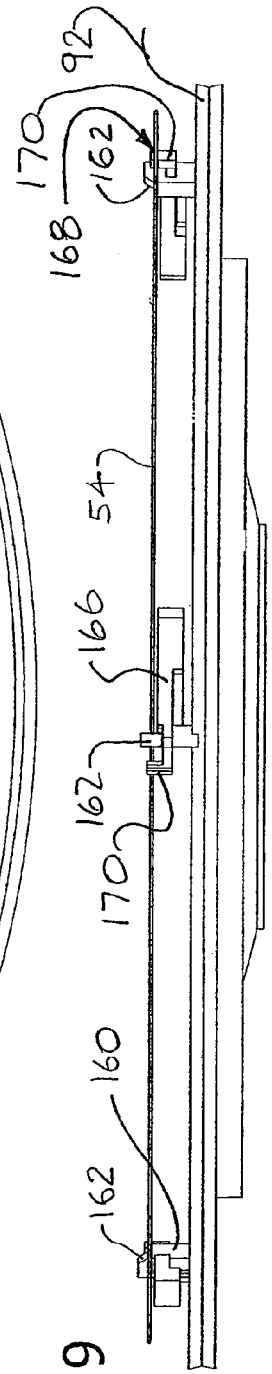
FIG. 8
FIG. 9

SYSTEM FOR PROCESSING A WORKPIECE

TECHNICAL FIELD

The invention relates to surface preparation, cleaning, rinsing and drying of workpieces, such as semiconductor wafers, flat panel displays, rigid disk or optical media, thin film heads or other workpieces formed from a substrate on which microelectronic circuits, data storage elements or layers, micromechanical, micro-electro-mechanical or micro-optical elements may be formed. These and similar articles are collectively referred to herein as a "wafer" or "workpiece."

BACKGROUND OF THE INVENTION

The semiconductor manufacturing and related industries are constantly seeking to improve the processes and machines used to manufacture microscopic devices, such as integrated circuits. The objectives of many of these improved processes and machines include decreasing manufacturing time requirements, increasing the yield of usable devices, decreasing contamination, improving the uniformity and efficiency of manufacturing, and reducing manufacturing costs.

In the processing of wafers, it is often necessary to contact one or both sides of the wafer with a process chemical in fluid form, i.e., a liquid, vapor or gas. Such fluids, which include rinse fluids such as water, are used to, for example, etch the wafer surface, clean the wafer surface, dry the wafer surface, passivate the wafer surface, deposit films on the wafer surface, remove films or masking materials from the wafer surface, etc. Process liquids are often recirculated in a processing system, to that they may be reused multiple times. This reduces manufacturing costs since less process liquid is needed, and less waste material is created. However, when different process fluids are recirculated within the same processing chamber, there is potential for mixing between them. This is known as cross contamination. In addition to reducing the potential for cross contamination of the processing fluids, controlling how the processing fluids are applied to the wafer surfaces, and effectively cleaning or rinsing process fluids from process chamber surfaces can also often be important to the success of the processing operations. Moving and handling wafers in ways which minimize generation of contaminant particles is also often important. Current systems and methods generally have disadvantages relating to one or more of these engineering design challenges.

SUMMARY OF THE INVENTION

A new wafer processing system has now been invented that provides significant improvements in manufacturing microelectronic and similar workpieces. A moveable drain assembly having multiple drain rings greatly reduces or eliminates cross contamination of process fluids. The drain rings may be spaced apart sufficiently to allow a process fluid applicator between them. Each drain ring provides a separate drain path, optionally in a separate recirculation loop carrying a single process fluid. The drain rings may be sequentially moved into position to collect process fluid moving off of the workpiece. As a result, process fluids may be more uniformly applied and used process fluids can be separately removed, collected, and either recycled or processed for disposal. Mixing of used process fluids is largely avoided. Several different process steps each using a different process fluid can therefore be performed within a single process chamber. As a result, less process equipment workpiece handling is needed. Process performance is improved while manufacturing costs are reduced.

Other features and advantages of the invention will appear hereinafter. The features of the invention described above can be used separately or together, or in various combinations of one or more of them. The invention resides as well in sub-combinations of the features described. The process chamber can be used alone, or in a system with robotic automation and various other process chambers.

BRIEF DESCRIPTION OF THE DRAWINGS

In the drawings:

FIG. 8 is a perspective view of a rotor which may be used in the processor shown in FIG. 4.

FIG. 9 is a side view of the rotor shown in FIG. 8.

DETAILED DESCRIPTION OF THE DRAWINGS

In a processing system having separate drains that can be moved into position to collect a process fluid from a workpiece, the drains are spaced apart to allow a movably fluid outlet to pass between them. The separate drains, in the form of drain rings, may have a curved upper wall that deflects fluid droplets with less splattering.

Figure 1:
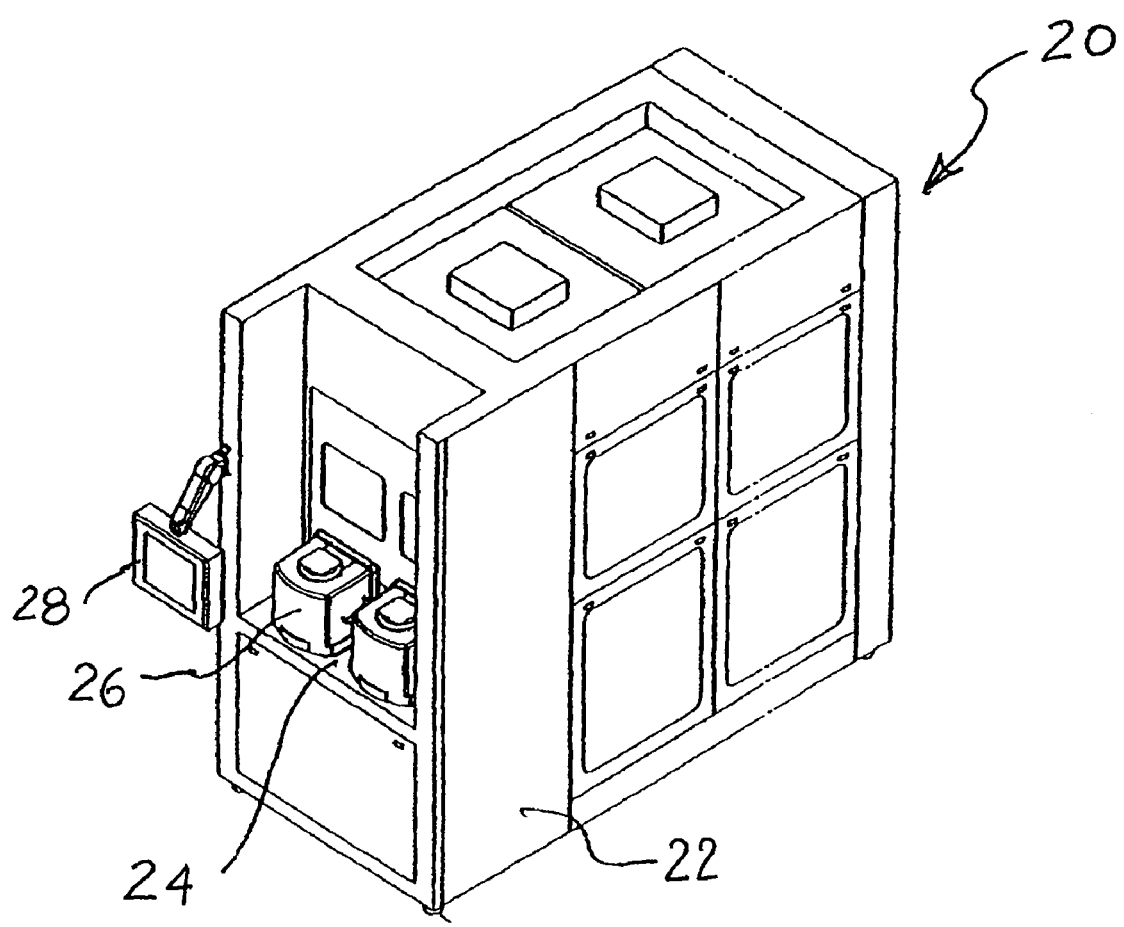
FIG. 1 is a perspective view of a processing system.

As shown in FIG. 1, a processing system 20 typically includes an enclosure 22, with a load/unload station 24 at one end or side of the enclosure 22. Containers 26 holding wafers may be placed at the load/unload station 24, for moving wafers into and out of the system 20. The containers 26 may be cassettes or other types of standard containers such as front opening unified pods ("FOUPS") as used in the semiconductor manufacturing industry. The system 20 ordinarily includes a display/controller 28 for monitoring and controlling system operations.

Figure 2:
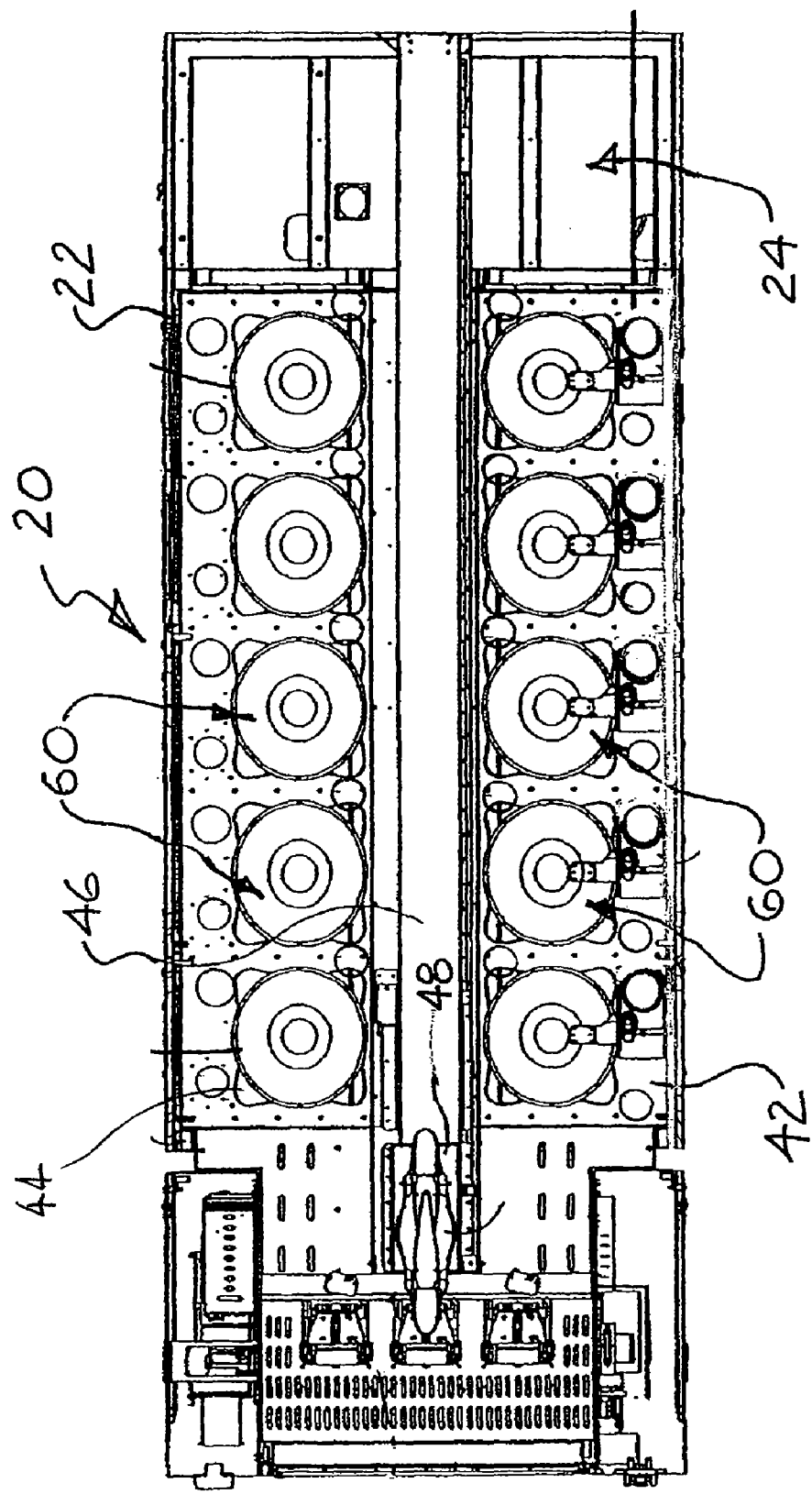
FIG. 2 is a plan view of the processing system shown in FIG. 1.
Figure 3:
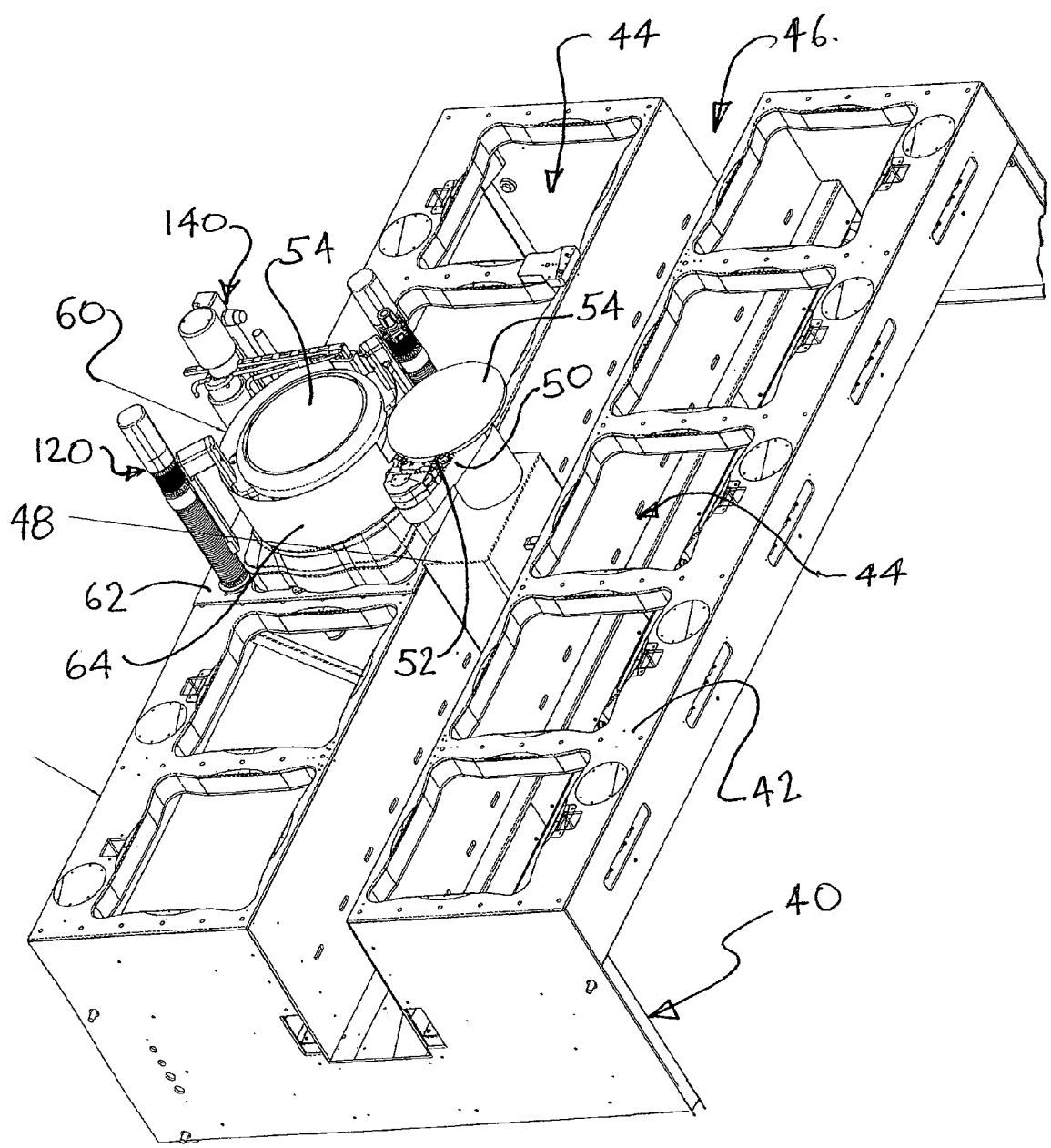
FIG. 3 is a perspective view of the deck assembly and one of the processors shown in FIG. 2.

Turning to FIGS. 2 and 3, the system 20 may have several processors 60 arranged in columns or rows, as shown in FIG. 2, or in other patterns such as in an arc or circle, a cruciform layout, etc. In the example shown in FIGS. 2 and 3, the processors 60 are aligned into spaced apart rows on the deck or top surface 42 of a rigid frame 40. The frame 40 shown in FIG. 3 has two rows of processor positions 44 spaced apart by a robot path 46 extending along the center of the frame 40. FIG. 2 shows a processor 60 installed in each processor position. FIG. 3 shows a single processor 60 installed on the deck 42, with the other processor positions 44 empty, for purpose of illustration. In an automated system such as shown in FIGS. 1-3, a robot 48 is provided for loading and unloading wafers 54 into and out of the processors 60. An end effector 52 on an articulated arm of the robot 50 can move a wafer 54 with precision, in three dimensions, into and out of the processors 60.

Figure 4:
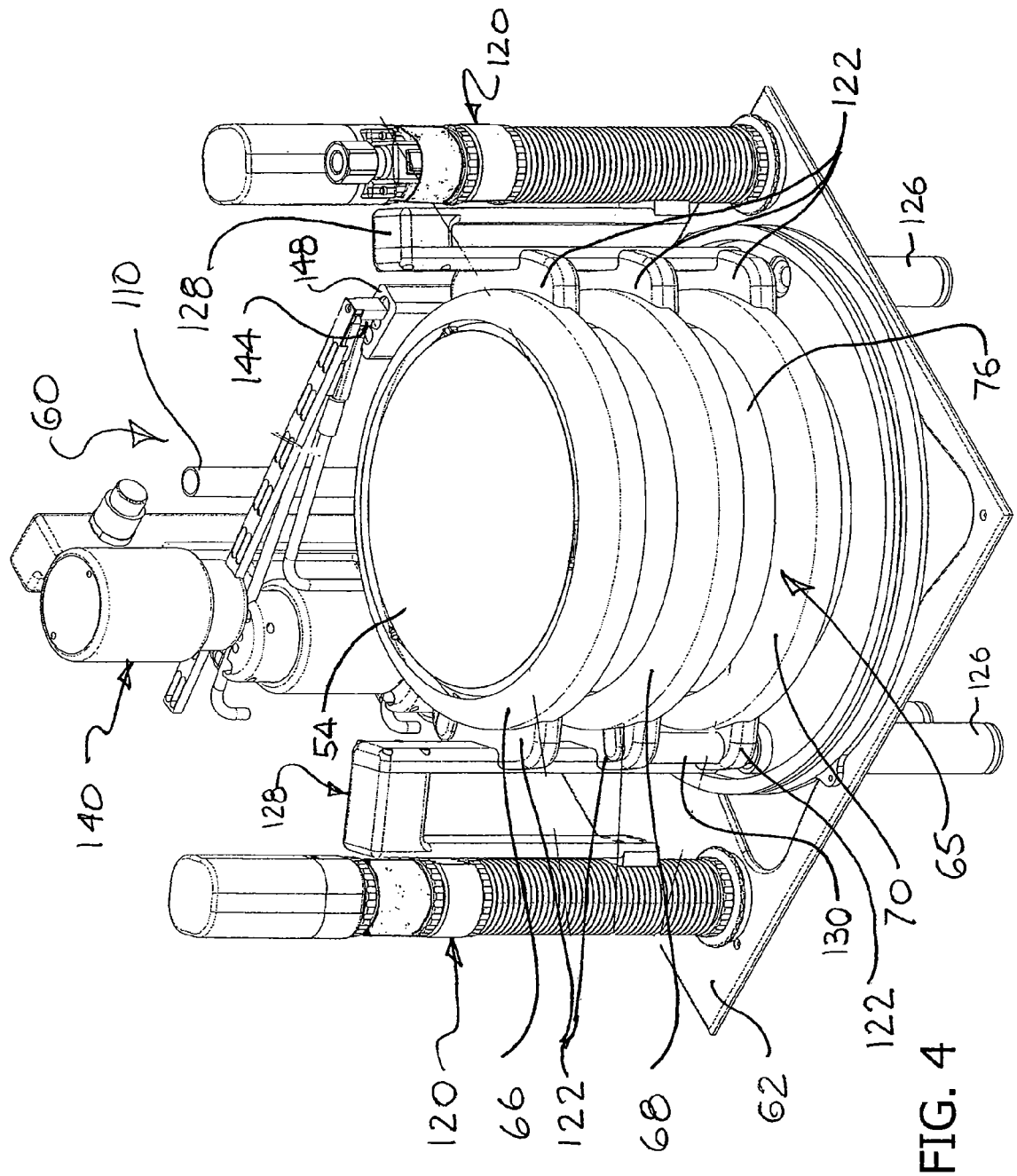
FIG. 4 is a perspective view of the processor shown in FIG. 3, with elements removed for purpose of illustration.
Figure 5:
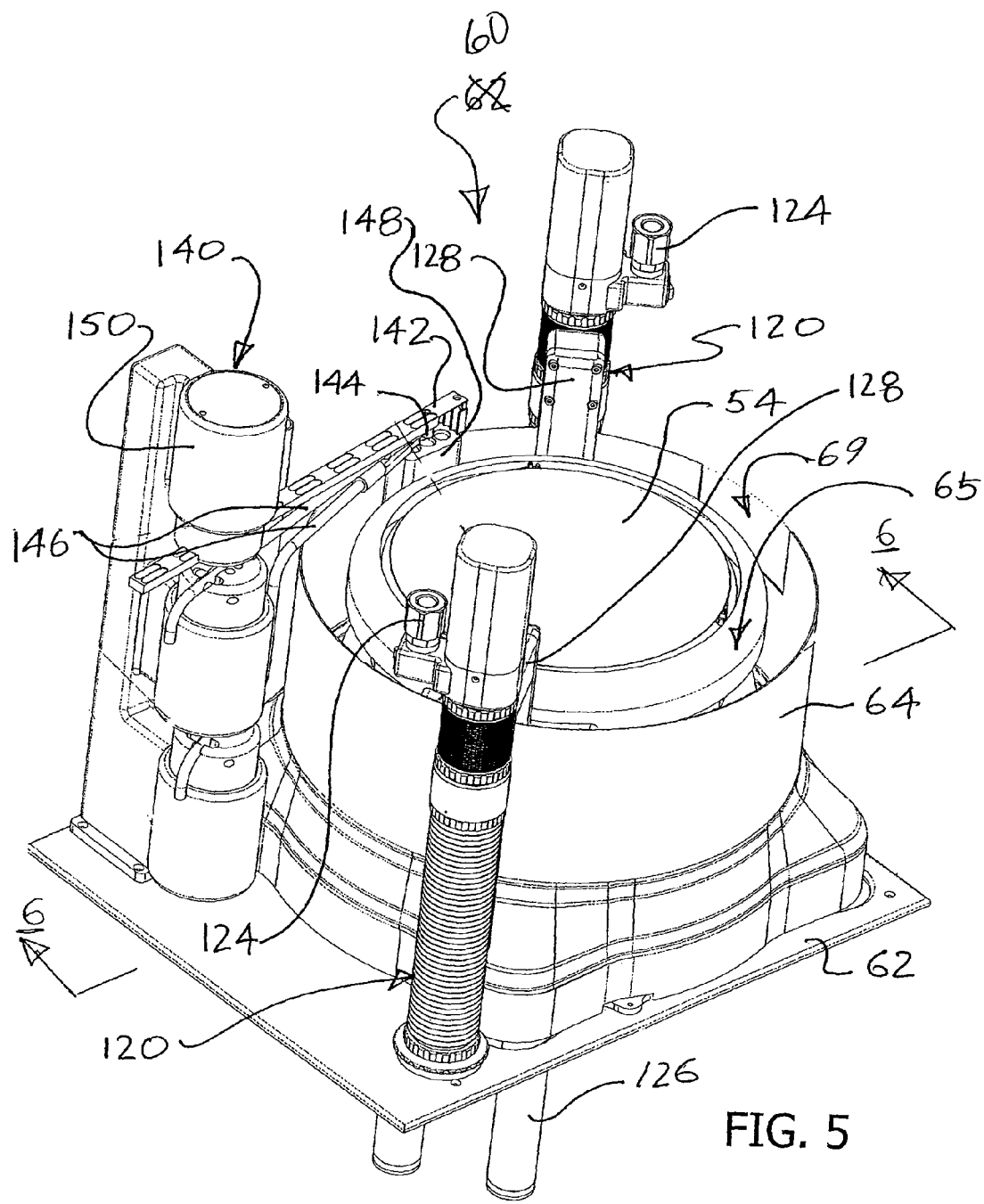
FIG. 5 is a perspective view of the processor shown in FIG. 3.
Figure 6A:
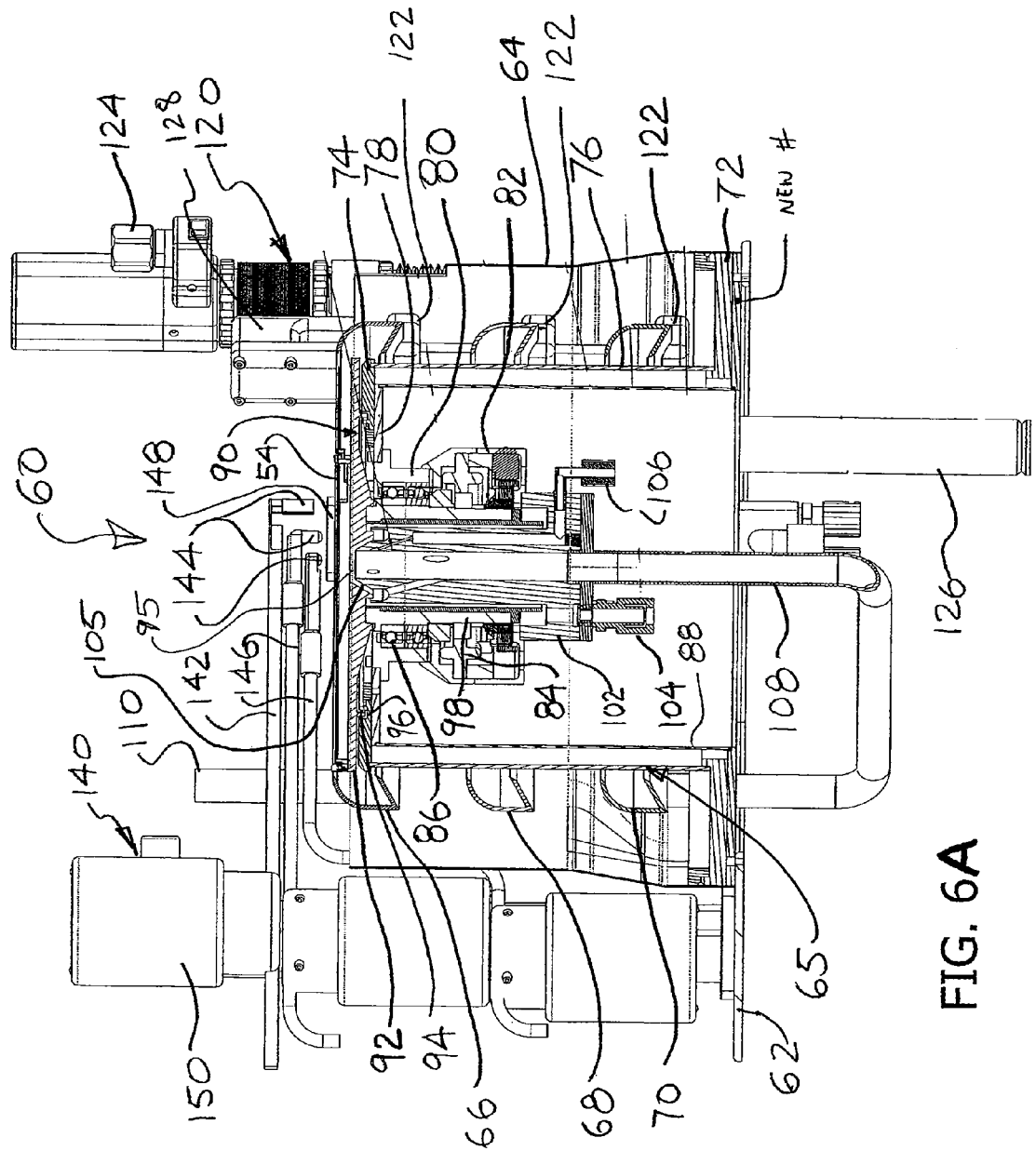
FIG. 6A is a section view taken along line 6-6 of FIG. 5 and showing the drain ring assembly in a first position.

Referring now to FIGS. 4, 5, and 6A, the processor 60 may be mounted on a deck plate 62. The deck plate 62 in turn may be precisely located on the deck 42 shown in FIG. 3 via locating pins or other precision locating features. If used, the deck plate 62 allows the processor 60 to be quickly and accurately replaced in the system 20, while maintaining calibration with the robot 48.

As shown in FIGS. 4 and 6A, a drain ring assembly 65 includes first, second, and third annular drain rings 66, 68, and 70. Drain ring arms 122 extend radially outwardly, generally on opposite sides of each drain ring. The drain ring arms on each side are attached to a lift arm 128 of a drain assembly lifter 120. The drain assembly lifters 120 raise and lower the drain assembly 65. The drain assembly lifters 120 may be electrically or pneumatically powered. In the electrically driven examples shown in FIG. 5, control/power cables may connect from above to the lifters 120 via connectors 124. Various other types of lifters may be used, including a single cantilever lifter, or lifters acting from below the drain ring assembly 65. Lifting the drain ring assembly from two opposing positions, as shown in FIG. 4, may be helpful with larger diameter drain rings, or drain rings made of plastics, such as Teflon fluorine resins, for chemical compatibility and corrosion resistance. The processor 60 shown in the figures is adapted to process 300 mm wafers. The drain rings therefore may have an inner diameter of about 304 to 310 mm. For processing wafers of other sizes, the drain rings may be correspondingly smaller or larger.

Referring to FIG. 4, each drain ring 66, 68, and 70 has at least one drain ring inner tube 130 extending down into a drain ring outer tube 126. Each drain ring outer tube 126 is generally connected to a recirculation line dedicated to a single process liquid. As the drain ring assembly 65 moves up and down, the inner tube moves up and down within the outer tube. With the drain ring assembly at its highest position, the inner tube 130 is still sufficiently overlapped by the outer tube to prevent any escape of liquid. Sliding seals may be provided between the inner tube and the outer tube to prevent escape of gas or vapors, but typically are not necessary. The inner tube and outer tube may be replaced by a flexible tube or coil.

Referring to FIG. 5, a shroud 64 surrounds the drain ring assembly 65. The shroud 64 may extend vertically from the deck plate 62 up to the position of the first drain ring 66, or slightly above it. A cut-out 69 may be provided in the shroud 64, to provide clearance for the end effector 52 of the robot 48. The lift arms 128 of the drain assembly lifters 120 extend over the shroud 64, and then down to attach to the drain ring arms 122. The shroud 64 may help to control the flow of air downwardly around the processor 60. Air openings may be provided in the deck plate 62 and the deck 42 for this purpose.

As shown in FIGS. 4 and 5, a process fluid delivery assembly generally designated at 140 is supported on the deck plate 62 alongside the shroud 64. The fluid delivery assembly 140 includes a swing arm 142 having nozzles or outlets 144, for delivering fluids (gases, vapors, or liquids) to the top or upfacing surface of the wafer 54. A swing arm motor 150 drives the swing arm 142 in an alternating, back and forth, movement above the wafer 54. Supply lines 146 carry process fluids from their storage locations to the nozzles 144. A recirculation drain 148 may be provided under the rest position of the swing arm 142. For some applications, it is advantageous to constantly maintain flow of process fluids through the system process fluid supply lines. With the swing arm 142 positioned to the side, over the recirculation drain 148, process fluids may be continuously pumped through the system, even when the processor is idle, with the process fluids moving out of the nozzles 144 and into the recirculation drain 148, for recirculation and re-use. The swing arm 142 may be replaced by one or more other arms or devices that are moveable to a fixed or changing position over the wafer.

Referring to FIG. 6A, the bottom end of the shroud 64, and the bottom end of an outer support cylinder 76 are attached to a base ring 72. A top plate 74 is attached to the upper end of the outer support cylinder 76. An inner cylinder 88 extends up from an inner plate 75 to a mounting plate 78 attached to the top plate 74. A motor housing 82 is attached to a sleeve 80 which is attached to the mounting plate 78. A rotor 90 has a rotor plate 92 spaced slightly above the top plate 74. A bearing sleeve 98 of the rotor 90 is supported by bearings 86. A motor 84 within the motor housing 82 drives the bearing sleeve 98 to rotate the rotor 90. A rotor ring 94 extends down into a groove 96 on the top plate 74.

To adapt the processor 60 for also processing the back side of the workpiece, a lower or back side fluid supply line may connect with a fluid inlet fitting 106 on a lower nozzle assembly 102, to provide a process fluid to a lower outlet or nozzle 105. An air pipe 108 may also be used to draw in air from an inlet 110 positioned above the processor 60. The air pipe 108 leads up to a center inlet 95 in the rotor plate 92.

Figure 7:
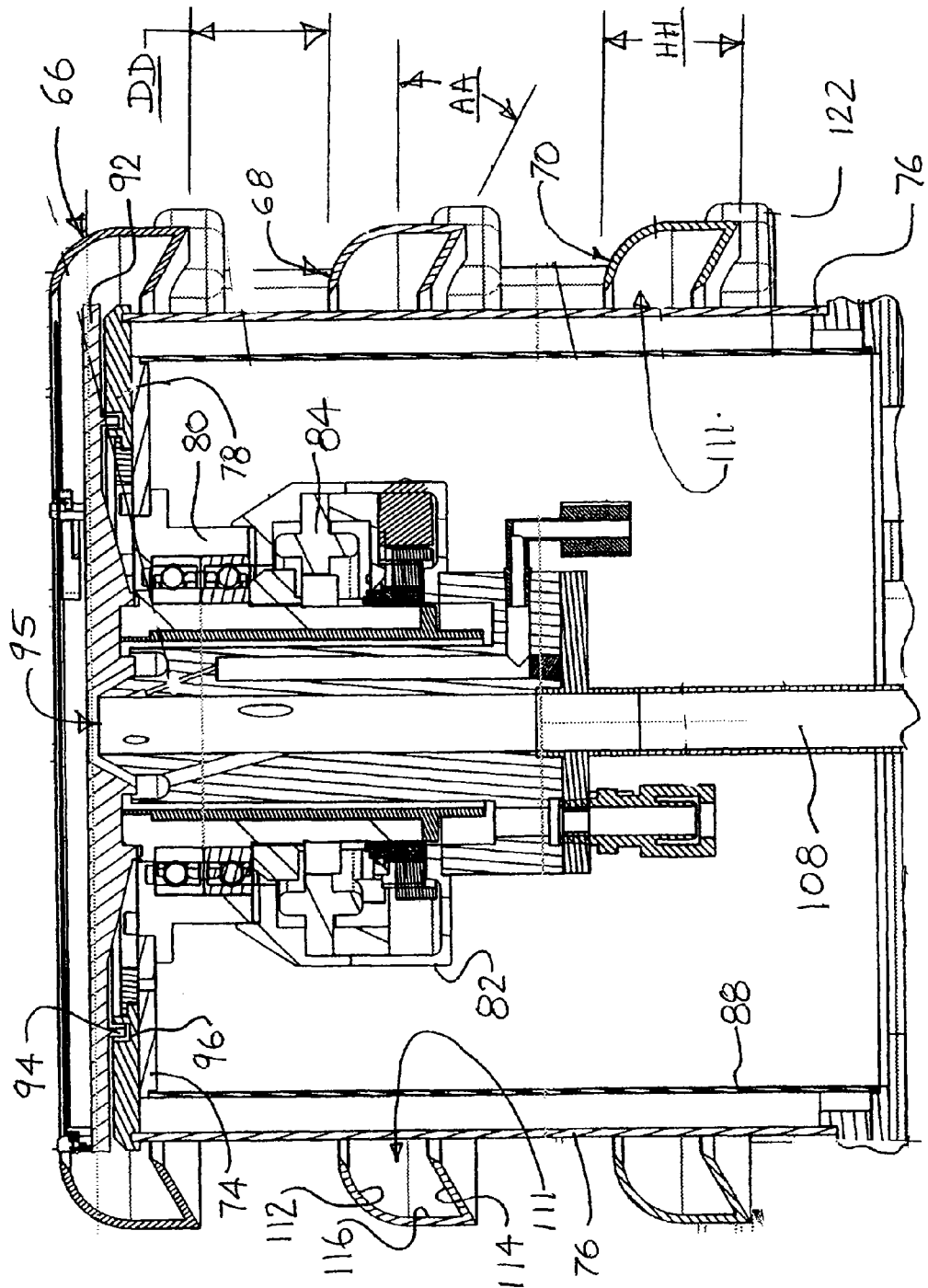
FIG. 7 is an enlarged view of the drain rings shown in FIG. 6.

Turning now to FIG. 7, the drain rings 66, 68, and 70 may have different sizes and shapes which vary with the process fluid collected by each drain ring. However, generally, the drain rings 66, 68, and 70 have the same design, as shown in FIG. 7. Each drain ring typically forms a complete (360°) ring around the outside of the cylinder 76. Each drain ring has an inwardly facing opening 111 formed between a curved top wall 112 and a bottom wall 114 joined to the top wall 112 via a side wall 116. The lower wall 114 may be flat and extend downwardly at an angle AA, as shown in FIG. 7, varying from about 5-45 or 15-35 degrees. Also, as shown in FIG. 7, the drain rings are spaced apart vertically by dimension DD. This vertical spacing between the drain rings allows the swing arm 142 or other process fluid dispenser to move between the drain rings. Process fluids can therefore be uniformly applied to the wafer, regardless of the position of the drain ring assembly 65. The height HH of the drain rings is selected so that the height of the opening 111 is sufficient to collect virtually all liquids moving off of the top and bottom surfaces of the wafer via centrifugal force, with minimal splattering.

Figure 10:
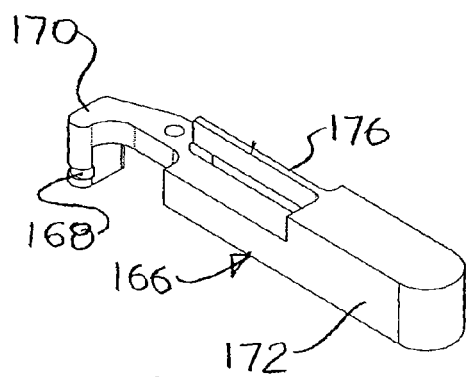
FIG. 10 is an enlarged perspective view of a finger shown in FIG. 8.

FIG. 8 shows one design which may be used for the rotor 90. Posts 160 are attached near the edge of the rotor plate 92 at three or more locations. A finger 166 is attached to each post 160 by a generally vertical pivot pin 174. Referring now also to FIG. 10, each finger 166 has a first end 170 including an edge slot 168 adapted to engage the edge of the wafer. The second end 172 of the finger 166 includes a spring 176 biasing the finger 166 into an open position. In the open position, the first end 170 of the fingers 166 is moved generally radially outwardly to a position that allows a wafer 54 to be moved vertically down onto the posts 160, without the first end 170 of the fingers 166 interfering with the downward wafer movement. Guide surfaces 162 may be provided on the fingers 166 to guide the edges of a wafer down onto a seat surface 164 on the post 160. The length of the second end 172 of the finger 166 is greater, e.g., 2-8 times greater, than the length of the first end (measuring outwardly from the pivot joint). The moment of inertia of the second end is also proportionally greater than the first end. Consequently, the fingers 166 can apply substantially holding force on a wafer, even at relatively lower spin speeds.

The processor 60 may be used as a stand-alone single unit, loaded and unloaded either manually or via a robot. However, more commonly, several processors 60 are provided in an automated processing system, such as the system 20 shown in FIGS. 1 and 2. In the system 20 shown in FIGS. 1 and 2, wafers 54 are moved to the system within containers 26. The containers 26 are placed at the load/unload station 24. Depending on the system specifications, the containers 22 may be docked at a docking station, where the container door is removed. The robot 48 moves to pick up a wafer 54 via the end effector 52, and carries the wafer 54 to a processor 60. The robot 48 places the wafer 54 onto the rotor 90 of the processor 60. As the robot lowers the wafer, the guide surfaces 162 on the posts 160 help to position and center the wafer. The wafer is supported from below on the seats 164 of the posts 160. As is apparent from FIGS. 1-4, the wafer 54 remains in the face up orientation.

The motor 84 is switched on causing the rotor 90 to rotate. Referring momentarily to FIG. 8, the second end 172 of the finger 166 moves outwardly under centrifugal force. Correspondingly, the first end 170 of the finger 166 moves inwardly, with the edge slot 168 engaging the edge of the wafer 54. The etch slot 168 on each of the three fingers 166 accordingly hold the wafer 54 securely in place on the spinning rotor 90.

With the drain ring assembly 65 in the position shown in FIG. 6A, the swing arm motor 150 may pivot the swing arm 142 in an arc, back and forth above the spinning wafer 154. Process fluids, in the form of liquids, gases, or vapors may be applied onto the top surface of the spinning wafer 54 from one or more of the nozzles or outlets 144 on the swing arm 142. The combination of the spinning workpiece and the alternating back and forth movement of the swing arm 142 helps to provide uniform application of process fluid onto the wafer.

The same, or a different process fluid, may be applied to the bottom or back side of the wafer 54 through the lower nozzle 105. Accordingly, both sides of the wafer may be processed, without the need to flip the wafer over. The spinning movement of the rotor 90 creates a low pressure zone around the center of the rotor. The low pressure draws air up through the center inlet 95 from the air pipe 108. The air pipe inlet 110 is located above most or all components of the processor 60, to better avoid drawing in any particles.

Liquids on the spinning wafer move outwardly under centrifugal force. Droplets of the liquid fly off the wafer edges and are collected in the first drain ring 66. The first drain ring 66 is usually positioned with the inside surface of the curved top wall 112 slightly above, the top surface of the wafer 54. Droplets flung off from the wafer edge collide with the curved top wall 112 and are guided down along the side wall 116 to the trough formed between the lower wall or floor 114 and the side wall 116, as shown in FIG. 7. The declining angle AA of the floor 114 causes liquid droplets to be collected substantially below the plane of the wafer, reducing potential for splatter or splash back onto the wafer.

Referring to FIG. 4, liquid collected in the trough of the drain ring 66 flows to one or more drain rings inner tubes 130 located at low points in the drain ring. The collected liquid flows out of the drain ring 66 into the drain ring inner tube 130, and then into the drain outer tube 126, for collection, recirculation, or disposal. Air drawn in through the center inlet 95 from the air pipe 108 moves outwardly between the rotor plate 94 and the back surface of the wafer 54, and into the drain ring, or around the drain ring and into the space between the shroud 64 and the cylinder 76, and then down and out of the processor.

Figure 6B:
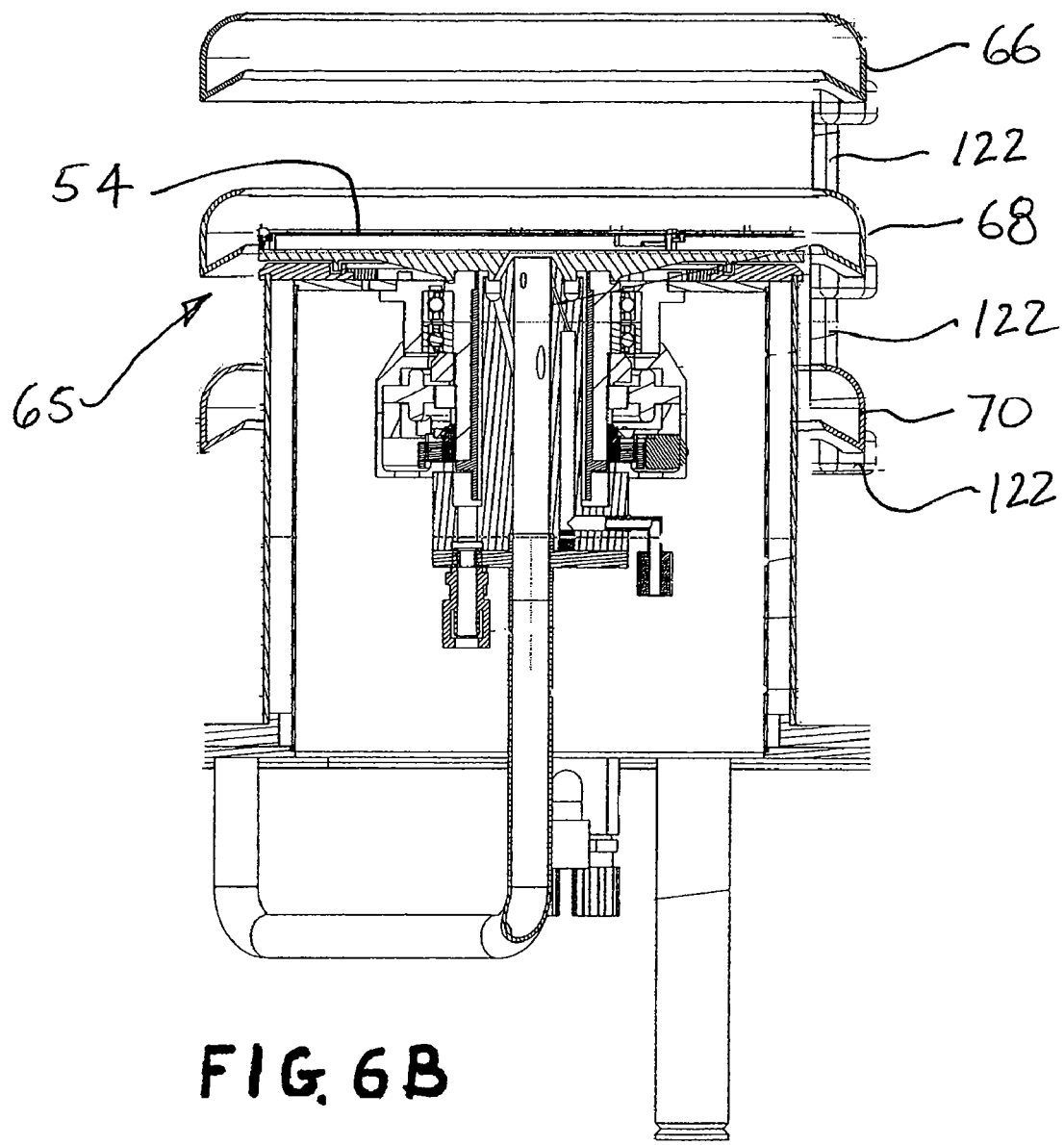
FIG. 6B is a section view taken along line 6-6 of FIG. 5 and showing the drain ring assembly in a second position, and with various components omitted for purpose of illustration.

In a second processing step using a different process fluid, the drain assembly lifters 120 are actuated to lift the drain ring assembly 65, from the position shown in FIG. 6A to the position shown in FIG. 6B. Consequently, in a second processing step, the second drain ring 68 is now positioned to collect a second process fluid. Since the second process fluid is collected separately from the first process fluid, there is little or no mixing between the process fluids. The second drain ring 68 has separate drain ring inner and outer tubes 130 and 126, leading to a separate collection, recirculation, or disposal line. To further avoid mixing of recirculated or re-used process fluids, a water rinse step may be performed after processing with the first process fluid. The water collected in the first drain ring 60 in the rinse step may be drained out of the processor or system, and not recirculated, via a rinse diverter valve in the recirculation line.

Figure 6C:
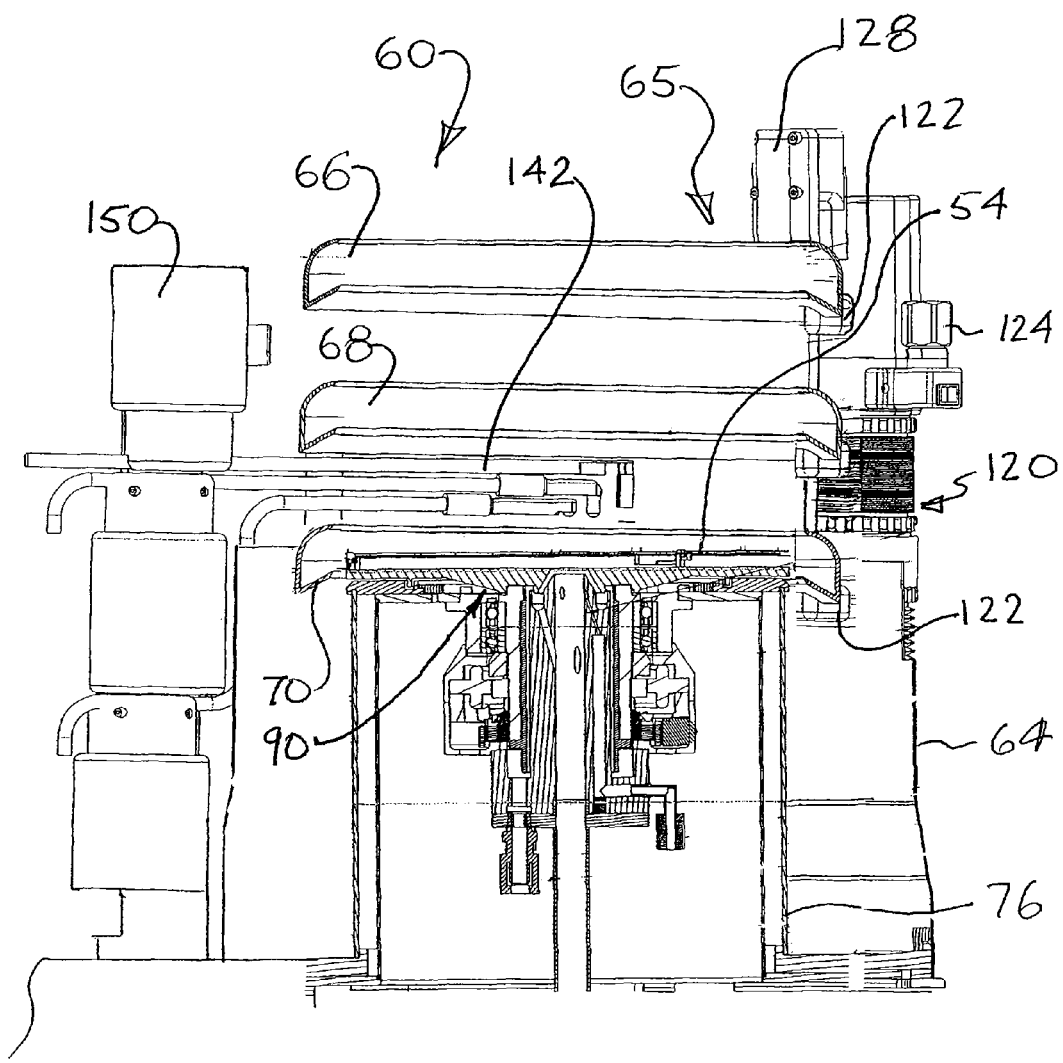
FIG. 6C is a section view taken along line 6-6 of FIG. 5 and showing the drain ring assembly in a third position.

Referring to FIG. 6C, in a third process step, the drain assembly lifter 120 lifts the drain ring assembly 65 into a third position, with the third drain ring 70 now aligned with the wafer 54. As shown in FIG. 6C, the drain rings 66 and 68, and 68 and 70, are spaced vertically apart by dimension DD (shown in FIG. 7) which allows the swing arm 142 to move between them. With the drain ring assembly 65 in the position shown in FIG. 6C, a third processing fluid may be applied to, and collected from, the wafer 54 by the third drain ring 70. Fluid collected in the third drain ring 70 is separately removed and recirculated. Consequently, different processing fluids may be sequentially used and recirculated in processing the wafer 54, with minimal or no intermixing between the process fluids.

The drain ring assembly 65 may have a fourth or more drain rings, to match the processor 60 with the number of process fluids used. The drain ring assembly 65 may also have only two drain rings, where only one or two process fluids are used. The design features of the drain rings described above may be used in a drain ring assembly having any number of drain rings, as well as in a single drain ring. In one example of use of a two drain ring design, a polymer removal fluid, such as ST250 is applied by a nozzle 144 with the processor as shown in FIG. 6B. The drain ring assembly 65 is then moved down to the position shown in FIG. 6A and a rinse step is performed using deionized water.

The processor 60 may optionally be set up with FIG. 6B as the starting position. With the first process step performed with the second drain ring 68 around the rotor 90, the stroke or movement needed by the drain assembly lifter 120 is reduced, since the drain ring assembly 65 need only move up or down by one drain ring position.

As shown in FIG. 9, the posts 160 hold the wafer 54 up off of the rotor plate 92. This allows the end effector 52 of the robot 46 to move between the rotor plate 94 and the wafer 54, to load and unload a wafer into and out of the rotor 90. Since the edge slots 168 only move into contact with the wafer edge as the rotor 90 spins up, the fingers 166 have virtually no contact with the wafer 54, except when the rotor 90 spins at moderate or high speeds. Consequently, with the rotor stationary or spinning relatively slowly, fluids applied to the wafer 54 can contact all areas of the top surface of the wafer, without interference from the wafer holding components on the rotor 90.

Figure 11:
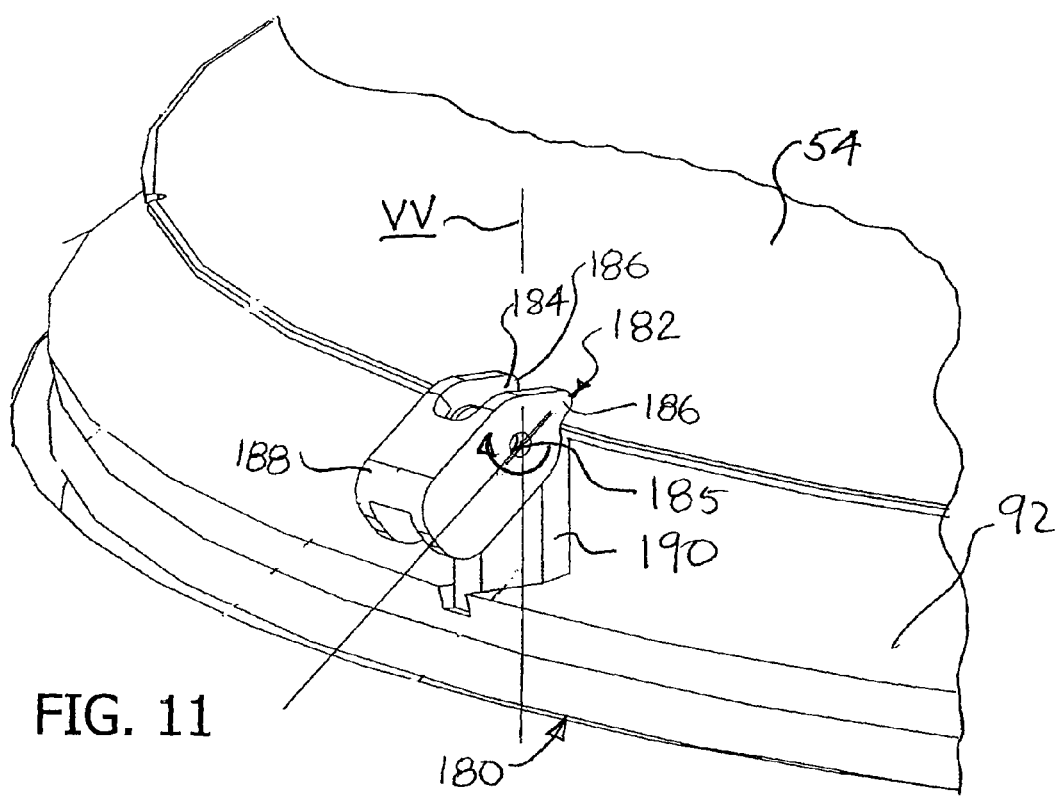
FIG. 11 is a partial perspective view of an alternative rotor design.

Referring to FIG. 11, in an alternate rotor design 180, a wafer edge retainer 182 is attached to a post 190 via a pivot pin 185. The pivot pin is oriented in a direction which is generally tangent to the edge rotor plate 92. With the rotor 180 stationary or spinning relatively slowly, the wafer retainer 182 is oriented generally along line VV, and with the projections 186 at the front end 184 of the retainer 182 pointing up. As a result, the wafer 54 may be loaded onto the rotor 180 by moving it down onto the posts 190, without interference from the wafer retainer 182.

As the rotor 180 spins at moderate to high speeds, the wafer retainer 182 pivots clock-wise (in the direction of the arrow in FIG. 11). This pivots the front ends 186 down onto the edge of the wafer 54, securing the wafer in place on the post 190. Since the movement of the wafer retainer 182 is driven by centrifugal force, the contact force applied by the retainer 182 on the wafer 54 is proportional to the spin speed of the rotor.

The use of the singular here includes the plural, and vice versa. The use of "or" here is not exclusive. Rather "or" as used here means either one or the other, or both, and without suggesting that one is or is not an equivalent of the other. The processor described above may be modified to have a fixed drain ring assembly, and a vertically moveable rotor. The processor described above may also be used with a fixed non-rotating workpiece platform, especially when used with gas or vapor phase process fluids.

Thus, novel processors, systems, and methods have been shown and described. Various changes and substitutions may of course be made, without departing from the spirit and scope of the invention. The invention, therefore, should not be limited, except to the following claims and their equivalents.

The invention claimed is:

1. Apparatus comprising:
a rotor rotatable about a rotation axis;
a swing arm having at least one fluid outlet, with the arm moveable to apply a fluid onto a workpiece on the rotor;
a first drain ring generally coaxial with the rotation axis;
a second drain ring generally coaxial with the rotation axis;
a drain ring lifter for vertically moving the first and second drain rings;
and with the swing arm movable horizontally from a first position outside of the drain rings, to a second position in between the first and second drain rings.

2. The apparatus of claim 1 with the first drain ring having a curved upper wall and a generally flat lower wall declining at 5-45 degree angle away from the rotation axis.

3. The apparatus of claim 1 further comprising a swing arm actuator for moving the swing arm in a back and forth movement.

4. The apparatus of claim 1 further comprising an air pipe extending up through the rotor.

5. The apparatus of claim 1 further comprising a plurality of workpiece supports each pivotably attached to the rotor, for supporting a workpiece on the rotor, while the rotor rotates with the workpiece.

6. The apparatus of claim 1 with the first drain ring attached to the drain ring lifter and with the second drain ring attached to the drain ring lifter, and with the first drain ring positioned by a fixed distance above the second drain ring.

7. The apparatus of claim 1 further comprising a shroud surrounding the drain rings.

8. The apparatus of claim 1 further comprising a third drain ring generally coaxial with the second drain ring, and with the swing arm also moveable in between the second and third drain rings.

9. The apparatus of claim 1 with the drain ring lifter comprising first and second lift assemblies positioned on substantially opposite sides of the rotor.

10. The apparatus of claim 1 further comprising a back side fluid outlet in the rotor.

11. The apparatus of claim 1 with the rotor and the swing arm vertically spaced apart by a fixed dimension.

12. The apparatus of claim 1 with the rotor supported at a fixed dimension above a base plate, and with the drain rings moveable together, vertically, relative to the base plate, to align the first or second drain ring with a workpiece on the rotor.

13. A workpiece processor, comprising:
a rotor rotatable about a rotation axis;
a fluid outlet in the rotor;
a fluid source connecting to the fluid outlet in the rotor;
a motor attached to the rotor and positioned on a first side of the rotor;
workpiece supports on the rotor adapted to support a workpiece;
a swing arm having at least one fluid outlet, with the arm moveable to a position over the rotor;
a drain ring assembly including first and second drain rings generally coaxial with the rotation axis and spaced apart in fixed positions relative to each other in a direction generally parallel to the rotation axis by a dimension sufficient to allow the swing arm to move between them, and with the swing arm moveable horizontally from a first position outside of the drain ring assembly, to a second position in between the first and second drain rings, within the drain ring assembly; and
at least one drain ring assembly lifter attached to the first and second drain rings for moving the first and second drain rings in a direction generally parallel to the rotation axis.

14. The workpiece processor of claim 13 with the drain ring assembly moveable via the drain ring assembly lifter from a first position where the first drain ring is substantially aligned in the same plane as a workpiece on the rotor, to a second position wherein the first drain ring is above the workpiece, and with the swing arm moveable between the first and second drain rings when the drain ring assembly is in the second position.

15. A workpiece processor, comprising:
a rotor;
workpiece supports on the rotor defining a workpiece holding position;
at least one fluid outlet in the rotor;
a swing arm above the rotor;
at least one fluid outlet on or in the swing arm;
a drain ring assembly positioned around the rotor and including first and second drain rings generally coaxial with the rotor, and vertically spaced apart from each other by a fixed distance;
lifting means for vertically moving the drain ring assembly relative to the rotor;
and with the swing arm movable horizontally from a first position outside of the drain ring assembly, to a second position in between the first and second drain rings, when the first drain ring is positioned above the workpiece holding position and second drain ring is positioned below the workpiece holding position.

16. The processor of claim 15 with the lifting means including a pair of linear actuators attached to the drain ring assembly.

* * * * *